(12) United States Patent
Allen

(10) Patent No.: US 6,289,128 B1
(45) Date of Patent: Sep. 11, 2001

(54) METHOD AND APPARATUS FOR SHARING A LEAST SIGNIFICANT BIT OF ENCODED DATA BETWEEN MULTIPLE NUMERIC DATA VALUES

(75) Inventor: James D. Allen, Uthai Thani (TH)

(73) Assignee: Ricoh Co., Ltd., Tokyo (JP)

(*) Notice: Subject to any disclaimer, the term of this patent is extended or adjusted under 35 U.S.C. 154(b) by 0 days.

(21) Appl. No.: 09/165,007

(22) Filed: Sep. 30, 1998

(51) Int. Cl.[7] .............................. G06K 9/36; H03M 7/34; H03M 7/30
(52) U.S. Cl. ............................ 382/232; 382/251; 341/51; 341/87
(58) Field of Search ..................... 382/232, 239, 382/236, 251, 166, 244; 341/50, 51, 52, 55, 87, 107

(56) References Cited

U.S. PATENT DOCUMENTS

| | | | |
|---|---|---|---|
| 5,751,860 | * | 5/1998 | Su et al. ................................ 382/244 |
| 5,757,852 | * | 5/1998 | Jericevic et al. ...................... 382/232 |
| 5,764,807 | * | 6/1998 | Pearlman et al. ..................... 382/240 |

* cited by examiner

*Primary Examiner*—Wenpeng Chen
(74) *Attorney, Agent, or Firm*—Blakely, Sokoloff, Taylor & Zafman LLP

(57) ABSTRACT

An encoding technique in which numeric data in a set of data is selected and the least significant bits (LSBs) of numeric data values in the numeric data are replaced with a single least significant bit that is shared by the numeric data values in the numeric data.

79 Claims, 5 Drawing Sheets

METHOD AND APPARATUS FOR SHARING A LEAST SIGNIFICANT BIT OF ENCODED DATA BETWEEN MULTIPLE NUMERIC DATA VALUES

FIELD OF THE INVENTION

The present invention relates to the field of data compression and decompression; more particularly, the present invention relates to performing lossy encoding by having multiple numeric data values share a single least significant bit.

BACKGROUND OF THE INVENTION

Data compression is a useful tool for storing and transmitting large amounts of data. For example, the time required to transmit an image, such as a facsimile transmission of a document, is reduced when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossy compression, numeric data such as signal or intensity data, or a transformed form thereof, are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Data in a transform-coded compressed set of data, such as a compressed image file, are transform coefficients. The compressed data represent integer values to which these coefficients have been rounded. Most of the rounded coefficients are zero. However, due to statistical coding, most of the bits in the compressed file are spent on detailing the non-zero coefficients.

The least significant bits of the coefficient, or other codeword, are relevant only when the SNR of the compression device is 6.02 decibels above the relevance level of the bits next in significance to the least significant bits. Many times, the least significant bit has very little effect whatsoever on decompressed signal quality. It would be desirable to eliminate the least significant bit when it does not provide any added value in the compressed set of data. But in JPEG and many similar methods such bits serve as place holders in the compressed file.

Another approach to recover some of the space that is essentially wasted in the compressed file due to inclusion of least significant bits is set forth in Silverstein and Klein, "Restoration of Compressed Image," Proceedings of SPIE on Image and Video Compression, pp. 56–64, vol. 2186, February 1994, San Jose, Calif. In Silverstein and Klein, coefficients near a threshold are handled specially to provide a separate lossless channel embedded with the ordinary bits of the least significant bit channel.

The present invention provides a technique for reducing the number of least significant bits in a set of compressed data (e.g., compressed files), while enhancing rate-distortion performance.

SUMMARY OF THE INVENTION

A method and apparatus for performing encoding of data is described. The method and apparatus provide for selecting a group of quantizable numeric data and replacing the least significant bits (LSBs) of the quantizable numeric data with a single LSB shared by each numeric data value in the quantizable numeric data.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1A:
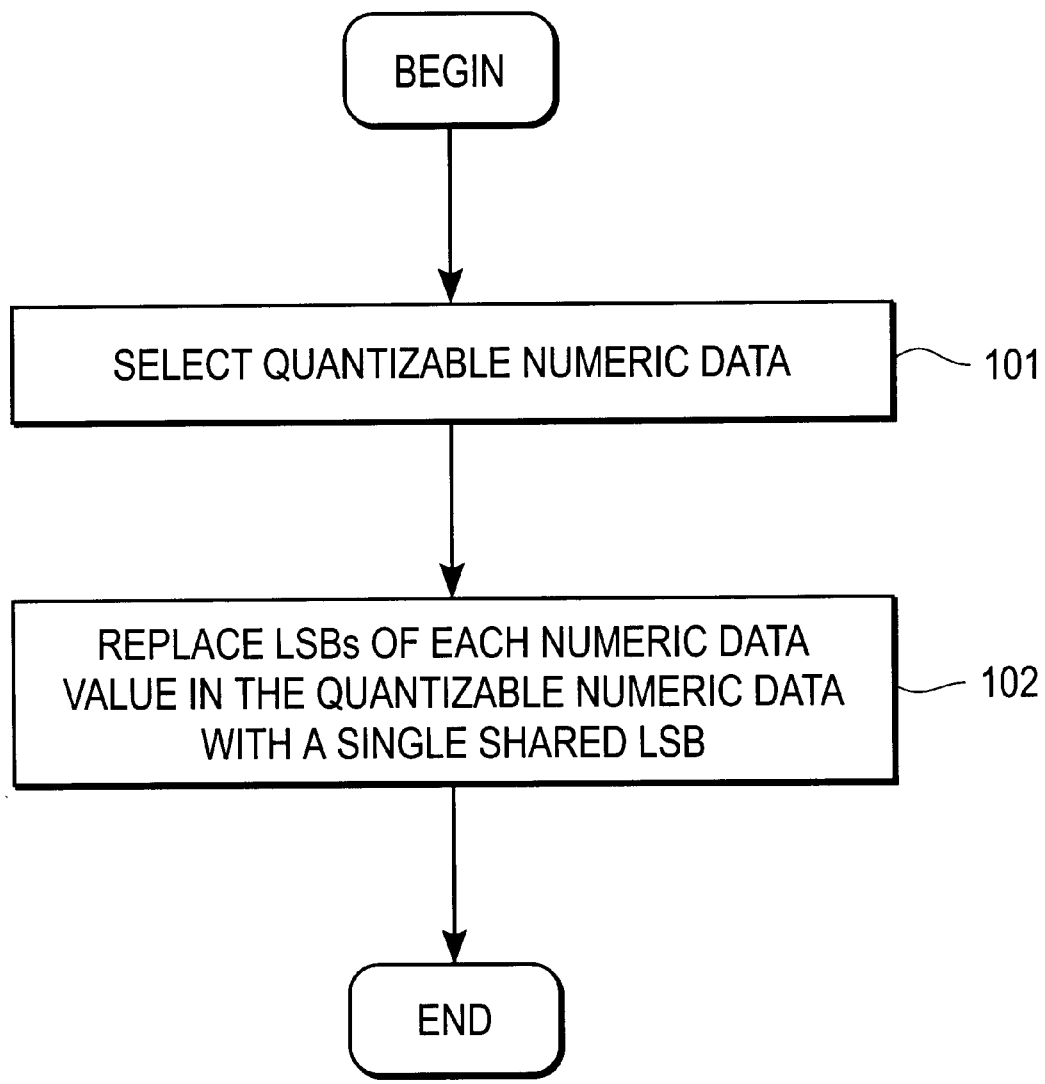
FIG. 1A is a flow diagram of one embodiment of the LSB encoding method.

A method and apparatus for performing encoding by replacing the least significant bits of a group of numeric data values with a single shared least significant bit is described. In the following description, numerous details are set forth, such as numbers of bits, block sizes, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating"

or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magneto-optical disks, read-only memories (ROMs), random access memories (RAMs), EPROMs, EEPROMs, magnetic or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview

The present invention provides for lossy encoding of data in which the least significant bits (LSBs) of quantizable numeric data in a block (or other grouping) are replaced by a single LSB that is shared among the numeric data values in the block. Thus, the quantizable numeric data is in a binary format having least significant bits. After replacement, the numeric data comprises quantized numeric data.

FIG. 1A is a flow diagram of one embodiment of the present invention. The present invention is performed by processing logic. The processing logic may be hardware (e.g., hardwired logic), software, or a combination of both (e.g., firmware, etc.). For instance, the present invention may be performed on a computer system.

Referring to FIG. 1A, the present invention begins by processing logic selecting a group of quantizable numeric data values (processing block 101). The data may, but need not, comprise coefficients that are generated as a result of applying a transform, such as, for example, the discrete cosine transform (DCT) or a wavelet transform. The selection of the group may be based on the format of the data. For instance, in a JPEG system where the blocks comprise 64 coefficients for a block comprising 64 pixels, the group selected may be the entire block of coefficients or a subset of the block. However, the grouping of numeric data values need not be block-based; in fact, any identifiable region, set or grouping may be used.

Once a group has been selected, processing logic replaces the least significant bit (LSB) of each of the numeric data values in the group with a single shared LSB. Therefore, for every N data in the group, the N LSBs are replaced by one LSB. In other words, the present invention spends one bit to encode N LSBs.

In one embodiment, the value selected for the shared LSB is based on the LSB values in the quantizable numeric data. For instance, the value of the shared LSB may be the binary value which occurs most often in the LSBs of the numeric data values in the numeric data.

In the case where all of the LSBs are the same value, the savings that results by not encoding all of the LSBs is great and does not affect the quality of the image. In cases where the LSBs are a majority of don't care values (i.e., values that are close to the threshold), the value may be selected by, for instance, selecting one quantizable numeric data value in the group to supply the LSB for the entire group. For example, if there are nine numeric data values in the group, the LSB of the ninth numeric data value may always be used to select the value of the shared LSB.

In another alternate embodiment, the selection of the shared LSB may be based on optimizing mean squared error (MSE). In one embodiment of such an optimization, the present invention uses majority-voting to set the shared LSB and sets the bit to one if and only if:

$$\sum_{x \in block} (2x - 2\lfloor x \rfloor - 1)\left(2\lfloor x \rfloor - 4\left\lfloor \frac{x}{2} \right\rfloor - 1\right) < 0$$

The notation $\lfloor . \rfloor$ means to round down or truncate and is sometimes referred to as the floor function.

As described in greater detail below, an adjustment may be made to the numeric data values in the numeric data after selection of the LSB value. The purpose of the adjustment is to reduce the distortion that results from replacing the LSBs with a single LSB.

Figure 1B:
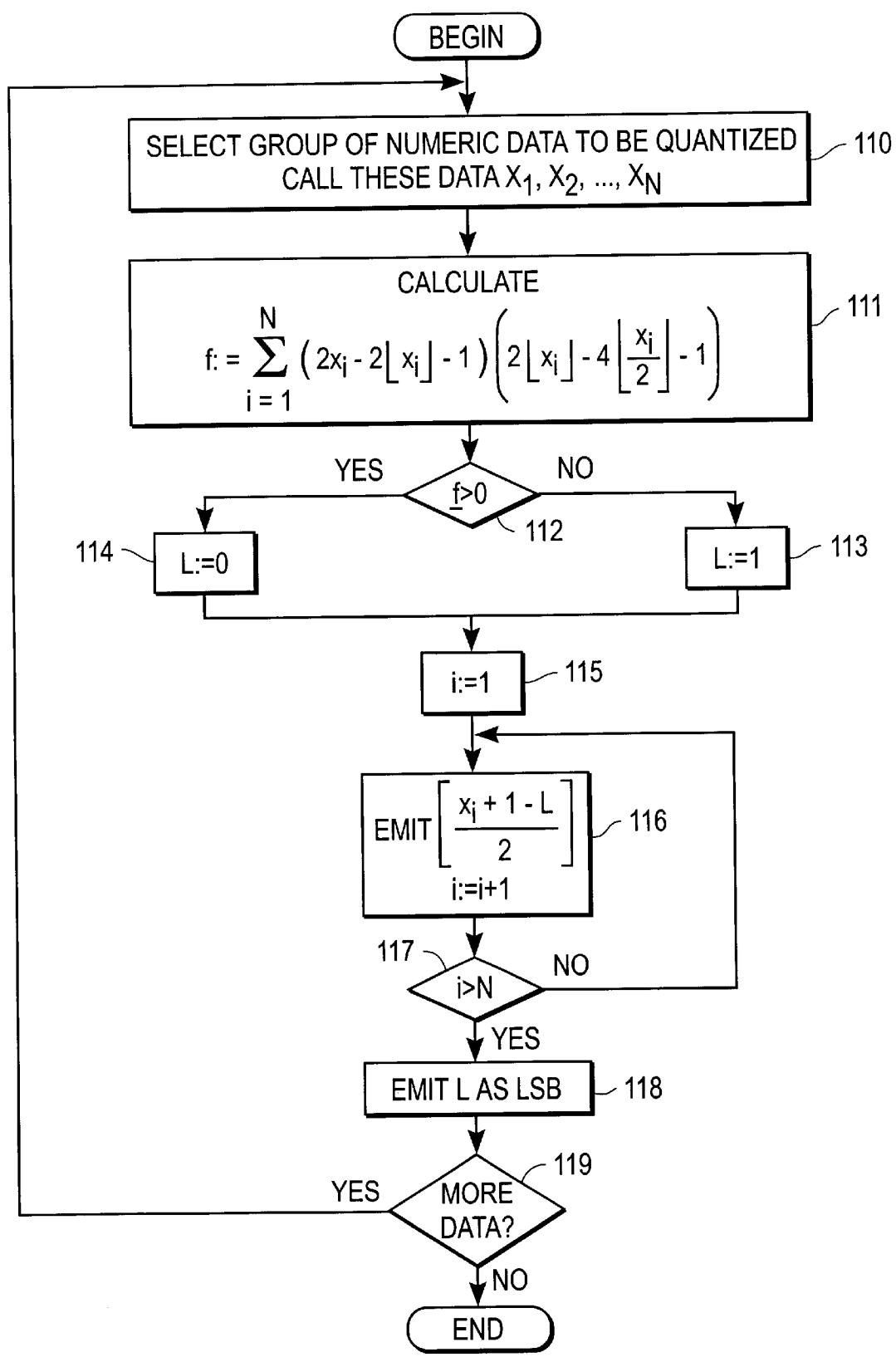
FIG. 1B is a flow diagram of one embodiment of the LSB encoding method.

FIG. 1B is a flow diagram of one embodiment of a process for encoding uniform data. The process is performed by processing logic, which may be hardware, software or a combination of both. Modifications to the process of FIG. 1B may be made to better accommodate strongly clustered data, such as data that is often zero. Such changes are described in greater detail below.

Referring to FIG. 1B, the process for encoding the uniform data begins by selecting a group of numeric data values to be quantized (processing block 110). These data values are referred to herein as $x_1, x_2, \ldots x_N$. The group of numeric data values may form a block (or any other identifiable grouping). Next, using the numeric data values, processing logic calculates the following function (processing block 111):

$$f := \sum_{i=1}^{N} (2x_i - 2\lfloor x_i \rfloor - 1)\left(2\lfloor x_i \rfloor - 4\left\lfloor \frac{x_i}{2} \right\rfloor - 1\right)$$

where $x_i$ refers to the data value. Note that another function may be used.

Then processing logic tests whether result of the function is greater than or equal to zero (or less than zero) (processing block 112). If the result of the function is less than zero, processing transitions to processing block 113 where the LSB, referred to as L, is set equal to 1, and the processing continues at processing block 115. If the result of the function is greater than or equal to zero, processing transitions to processing block 114 where the LSB value L is set to 0, and processing then continues at processing block 115.

At processing block 115, variable i is set equal to 1. Next, processing logic applies an emit function to output all of the bits of the data value being quantized without the shared LSB as follows:

$$EMIT\left\lfloor\frac{x_i+1-L}{2}\right\rfloor$$

and the variable i is incremented by 1.

Note that the data value is modified to reduce the distortion caused by the shared LSB.

Processing logic then tests whether the variable i is less than or equal to N (processing block 117). If it is, processing loops or feeds back to processing block 116. Otherwise, processing continues to processing block 118 where the LSB value L is emitted as the shared LSB for the numeric data values $X_1, X_2, \ldots X_N$. Thereafter, a test determines if there is more data to be encoded (processing block 119). If more data is to be encoded, the processing loops back to processing block 110 and the process is repeated. On the other hand, if the end of the data has been reached, the process ends.

In one embodiment, in processing block 116, an adjustment is performed to reduce distortion that results from use of the shared LSB. The adjustment is performed on each numeric data value to take into account the choice of the shared LSB. An adjustment may not be necessary to all of the data values in a particular grouping, only those where the adjustment reduces the distortion that occurs by using the shared LSB. The adjustment may be illustrated by an example which is as follows:

|  | Quantizable Datum | Binary Quantized Datum | Decimal Output Datum |
|---|---|---|---|
| Normal: (a) | +15.3 | 00111 1 | 15 |
| Wrong: (b) | +15.3 | 00111(0) | 14 |
| Right: (c) | +15.3 | 01000(0) | 16 |

The first row, (a), shows normal quantization without undergoing LSB sharing. Now suppose that LSB sharing is applied and the shared LSB turns out to be 0. The second row, (b), shows the result when the shared LSB is applied without an adjustment step. Distortion has increased from 0.3 to 1.3 (from |15–15.3| to |14–15.3|). The third row, (c), shows the result when the shared LSB is applied and an adjustment step corrects the most significant bits (MSBs). Now distortion is only 0.7 (|16–15.3|). Thus, the process performs an adjustment based on the data value. The adjustment is performed in processing block 116 and affects the formula in processing block 111.

Decoding of Data (Uniform Distribution)

The procedure to decode data encoded pursuant to FIG. 1A focuses on computing the reconstructed datum $\tilde{X}_i$. In one embodiment, the reconstructed datum is computed according to the following equation:

$$\tilde{x}_i = 2Y_i + L - \frac{1}{2}$$

where $Y_i$ is the MSB datum emitted in processing block 116 and L is the shared LSB.

Signal to Noise Ratio

The signal to noise ratio (SNR) advantage resulting from the present invention can be calculated analytically for uniformly distributed data. Table 1 sets forth the signal to noise ratio gain and the associated mean squared error (MSE) for various block sizes of the present invention.

TABLE 1

| LSB-Sharing Blocksize (L) | SNR Gain | MSE |
|---|---|---|
| 1 | 0 | 1/3 |
| 2 | 0 | 2/3 |
| 3 | .2571dB | 19/24 |
| 4 | .3657dB | 13/15 |
| 5 | .4215dB | 2641/2880 |
| 6 | .4506dB | 601/630 |
| 7 | .4658dB | 316931/322560 |
| 8 | .4729dB | 4561/4536 |
| 9 | .4754dB | 47585857/46448640 |
| 10 | .4749dB | 1038337/997920 |
| 11 | .4726dB | 64639005413/61312204800 |
| 12 | .4603dB | |
| 20 | .4192dB | |
| 30 | .3774dB | |
| 50 | .3190dB | |

Referring to Table 1, note that the SNR gain is derived from the MSE by:

$$SNR = -\frac{6.0206}{L} + 10\log_{10}\frac{4}{3MSE}.$$

When L=1, there is no "sharing". When L=2, sharing may occur but the SNR gain is zero. As indicated above, when L equals 9, the SNR gain is at its highest, where an average of 0.111 bits are used to encode each LSB. However, the expected accuracy (SNR) is improved as much as if 0.1901 additional bits have been spent normally (by reducing the irrelevance or coarseness factors). Thus, the present invention uses almost zero bits to store each LSB and stores it quite inaccurately. Furthermore, the selection of block size may be used to control the bit rate or SNR.

The present invention also has advantages over Silverstein's method described above, particularly when handling large block sizes. While Silverstei's method requires the use of a smaller block size, the present invention provides performance benefits even with large blocks.

Exemplary System Description

Figure 2:
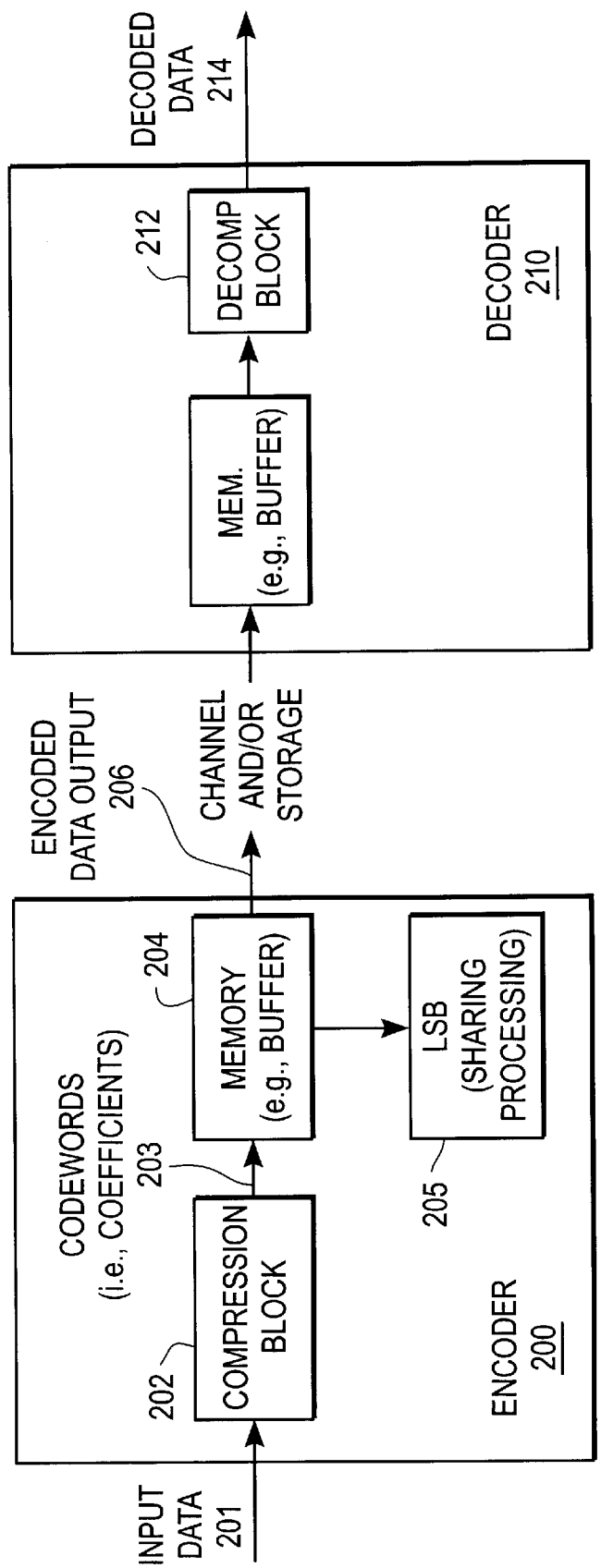
FIG. 2 illustrates a block diagram of one embodiment of the system that includes an encoder and a decoder.

FIG. 2 illustrates a block diagram of one embodiment of a compression/decompression system of the present invention. Referring to FIG. 2, input data 201 is received by compression block 202 of encoder 200 which generates quantizable numeric data 203. Compression block 202 may be a transform such as a DCT, wavelet or other transform. In such a case, the output of compression block 202 comprises coefficients. Compression block 202 may perform one or more other compression techniques. Compression block 202 may also include an ordering such as, for example, zigzag ordering or embedded ordering. In this case, the output of compression block 202 comprises ordered data, such as ordered coefficients.

The values of quantizable numeric data 203 are stored in memory 204. Memory 204 may comprise a buffer, FIFO, random access memory (e.g., Dynamic RAM (DRAM), static RAM (SRAM), Rambus DRAM (RDRAM), synchronous DRAM (SDRAM), etc., or any storage area accessible for processing. LSB processing block 205 accesses memory 204 to obtain quantizable numeric data stored therein to generate a shared LSB for the quantizable numeric data values. The quantizable numeric data is in at least one grouping (e.g., one or more blocks). Once LSB processing 205 has completed generating a shared LSB, the further encoded data is stored back into memory 204.

The encoded data stored in memory 204 is thereafter output as encoded data output 206 to a channel and/or storage. In one embodiment, encoded data output 206 comprises a header or tag which includes an indication of the value of the shared LSB for some portion of the data. For instance, the portion of the data may be for a group or block of numeric data. In this case, the header specifies the LSB for the numeric data values in the group or block. In an alternate embodiment, a single header (or tag) may specify multiple LSBs for multiple groups or blocks of numeric data. In alternate embodiments, a separate channel or side band signal path may be used to send the shared LSB(s) to a decoder (and/or message). Many other transfer techniques would be apparent to those skilled in the art.

It should be noted that in other embodiments, additional encoding techniques are employed on the data values after generating the shared LSB. For instance, Huffman coding may be applied to the data values (less the LSB) and their shared LSB. Corresponding decoding techniques could be applied during decompression. Any coding technique(s) may be used. Similarly, one or more encoding techniques may precede the LSB processing during compression, while corresponding decoding techniques would follow the LSB processing during decoding.

A decoder 210 may be used to decode the decoded data output 206. Decoder 210 included memory 211 which may comprise a buffer, FIFO, RAM, or any storage area, which stores the encoded data output 206. Decompression block 212 decompresses the encoded data stored in memory 211 and generates decoded data 214. Decoder 210 may include corresponding decoder hardware and/or software for decompressing technique needed to each encoding technique employed in the encoder.

When decoding, the decompression block knows where in the bit stream the shared LSB is in order to properly reconstruct the data. The data stream may include an identifier (e.g., code) to indicate the shared LSB for a group of data values. An identification as to the amount of data values that "share" the shared LSB may also be indicated, particularly where the group size changes.

Note that the encoder 200 and decoder 210 may be a single device manufactured on a single integrated circuit chip. In alternative embodiments, encoder 200 and 210 are one or more than one integrated circuit chip or device. In another embodiment, encoder 200 and/or decoder 200 comprises software executed on a computer system.

Alternative Embodiments

In one embodiment, zero coefficients are distinguished from non-zero coefficients and the LSB sharing is applied to only non-zero coefficients. This is because, for values very close to zero, the selection of an LSB to be shared among multiple coefficients or other numeric data may actually move the data away from zero.

In one embodiment, the very high frequency subbands which are mostly zero are coded without using the LSB sharing method. For other subbands, the zero coefficients may undergo LSB sharing.

In one embodiment, the shared LSB can serve one coefficient in the block furthest from threshold, while not causing significant effect for coefficients near threshold.

In some embodiments, reconstructed coefficient levels are made non-zero and/or scaled to simplify handling of data near zero. Examples of such reconstructed coefficient domains include (a) the integers plus0.5:
    . . . ,−1.5,−0.5,+0.5,+1.5,+2.5, . . .
(b) the integers plus 0.25 or 0.75:
    . . . ,−2.5,−1.25,−0.75,−0.25,+0.25,+0.75,+1.25, . . .
(c) example (b) with an adjustment to reduce errors near zero
    . . . ,−1.25,−0.75,−0.15,+0.15,+0.75,+1.25, . . .

Thus, in the case of (a) above, the LSB has weight of 0.5 and if the reconstructed coefficient level is without the LSB and the shared LSB is on (LSB is a 1), then the reconstruction level is 2.5.

A conservative reconstruction policy may be used near zero. For instance, given normal reconstruction levels: −2,−2,−1,−1, 0, 0,+1,+1, . . .
the levels preferred with the LSB sharing might be: −2.25,−1.75,−1.25,−0.75,−0.15,+0.15,+0.75,+1.25, . . .

In application to a JPEG type system, all 64 coefficients in the same block may be treated as a single block with one shared LSB for the entire block. In JPEG, since many of the high frequency coefficients are zero or near zero, the LSB sharing may be applied to some portion of the coefficients in a block. For instance, each block of 64 coefficients may be divided into a number of subblocks or subgroups, each having their own shared LSB.

Also, an LSB sharing method described herein may be applied to the first 32 coefficients in the block (as determined by zigzag ordering). In such a case, one bit would be inserted into the block to indicate the LSB for these coefficients.

In one embodiment, the inclusion of an extra bit may be performed by modifying the q-matrix used for the particular implementation. In such a case, a number in the q-matrix may be divided in half. This might indicate to a customized JPEG decompressor that a shared LSB exists for all coefficients in the block. An ordinary JPEG decompressor would then simply apply the shared LSB to the single coefficient whose q-matrix value was halved, and therefore would produce images with slightly reduced fidelity using such an implementation, while a witting decompressor would improve fidelity.

Thus, LSB sharing can be embedded in a JPEG compatible file in which the coefficients are divided into smaller groups and the file is configured so that the shared LSB is attached to just one of the coefficients in the group. A witting decompressor will obtain the SNR advantage while an unwitting decompressor suffers some modest SNR loss.

There is a certain amount of distortion with representing coefficients with, for instance, seven bits. This amount of distortion is 6.02 decibels greater than if representing the coefficients with eight bits. In other words, the more bits the less distortion. Upon creating a distortion curve, a scaling factor would enable an adjustment to the distortion with an increased or decreased the number of bits. Using the LSB sharing described herein enables a result under this distortion curve. In other words, the present invention allows for improved fidelity over the case of quantization.

In an alternate embodiment, the LSB described herein may be combined with a method such as, for example, set forth in Silverstein and Klein in which a modular residue side channel is used to add extra information to a JPEG file without increasing its size. In this embodiment, the LSBs are divided into blocks and the sum of each block, modulo 2, becomes a bit in a lossless side channel. By performing the LSB sharing of the present invention on L-sized blocks, a modular side channel bit from K of the LSBs sharing blocks (i.e., the side channel bit rate is 1/K×L) may be developed. In such a case, the best SNR gain occurs when L=5 and K=4. This offers a fairly modest gain over the LSB sharing alone.

LSB Sharing for Zeroish Data

Often data will not be uniformly distributed and is strongly clustered near zero, modeling a bell-shape curve, for example. Such data is "zeroish"—it will usually be quantized to zero, or some value close to zero (notably −1 or +1). The process shown in FIG. 1A may not be appropriate in this case.

Three variables are introduced, B, D and K, to vary the behavior of the quantization system. These variables, thus, are used to form an optimized quantizer in selecting a shared LSB. The variables ±B are the reconstruction levels for any zero biased by the LSB sharing (The bias and its influence on reconstruction levels is discussed in more detail below). The variable D is a bias for the quantization thresholds, where the quantization thresholds are used by the compressor to determine the compressed value for a particular data value being compressed. The value 2D+0.5 is the "zero-width" (D=0.25 thus provides the nominal unit width). The variable K is the ratio between forms of the two coding costs: rate and distortion. Both the rate and distortion of the compression system are functions of B, D, K and the input signal statistics. The variable K has the effect of a Lagrange multiplier to make rate and distortion jointly fungible. By jointly optimizing B, D, & K, the best rate distortion combination may be obtained.

Shown are the quantization thresholds applied by the compressor for the two settings of the shared LSB and reconstruction levels for three cases: shared LSB=0 (shared LSB off), no LSB (unwitting decompressor), and LSB=1 (shared LSB on). In one embodiment, the compressor is compliant with an "unwitting" decompressor that uses the Z-lattice, e.g., baseline JPEG. In other words, the present invention is embedded in an unwitting standard like JPEG. (The LSB-off and LSB-on systems are identical to each other if both mirror- and sign-reversed.) B=D=0.25 gives the usual, uniform clustering.

Reconstruction Levels

| | | | | | | |
|---|---|---|---|---|---|---|
| S-LSB off: | −4.25 | −3.25 | −2.25 | −1.25 | −B +0.75 | +1.75 |
| unwitting: | −4 | −3 | −2 | −1 | 0 +1 | +2 |
| S-LSB on: | −3.75 | −2.75 | −1.75 | −0.75 | +B +1.25 | +2.25 |
| Quantization Thresholds | | | | | | |
| S-LSB off: | −3.5 − D | −2.5 − D | −1.5 − D | −.5 − D | D | +1.5 D |
| S-LSB on: | −3 − D | −2 − D | −1 − D | − D | +0.5 + D | +1 + D |

The fact that all reconstruction levels (except the ±B for zero) are non-integers J±¼ is a result of supporting the "unwitting (JPEG) decompressor;" an arbitrary Z lattice is available in unconstrained systems.

The quantization policy is given explicitly by an arithmetic formula which implements the thresholds just given. Let L=1 when the shared-LSB is on, and let L=0 when it is off. The quantized (integer) value output for $X_i$ is then given by $$\left\lfloor X + D + \frac{(1-L)}{2} \right\rfloor \text{ when } x_i \le 0$$

$$\left\lfloor X + 1 - D - \frac{L}{2} \right\rfloor \text{ when } x_i > 0$$

Note that the thresholds and reconstruction levels of prior art algorithms may be difficult or even impossible to directly apply here because the quantization is dependent on the LSB sharing employed.

The policy is to set the shared LSB to 1 if and only if $$\sum_{x \in block} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \ge 1 \\ -z + K + 0.5\lfloor z + .5 - D \rfloor & \text{if } \lfloor z + 1 - D \rfloor > \lfloor z + .5 - D \rfloor \ge 1 \end{cases}$$

The three parameters, K, B and D may be tuned with given criterion and training set, especially if good starting values are interpolated from the following table of optimal K, B, and D variables for selected embodiments and for selected bit rates.

| Bit rate | optimal K | optimal B | optimal D |
|---|---|---|---|
| Low (e.g., 0.6) | .20 | .05 | .47 |
| Medium | .13 | .13 | .36 |
| High (e.g., 2.5) | .06 | .20 | .30 |

The bit rates are in bits per datum or signal point (e.g., pixels in the case of a black and white image).

Figure 3:
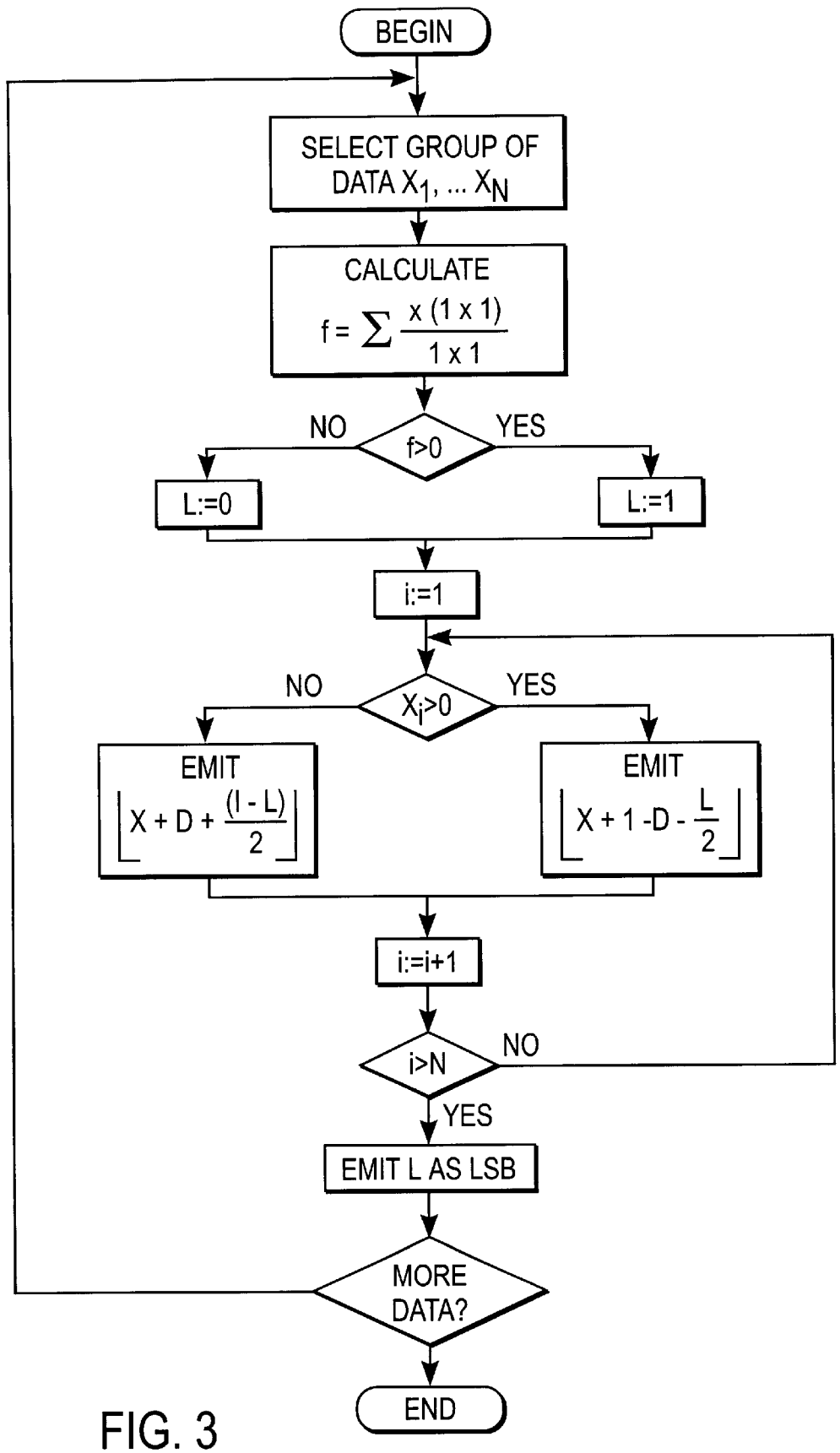
FIG. 3 is a flow diagram of an alternate embodiment of the LSB encoding method.

FIG. 3 is a flow diagram of the process for encoding strongly clustered data, such as data that is often zero. Referring to FIG. 3, the process begins by selecting a group of numeric data values to be quantized (processing block 301). These data values are referred to herein as $x_1, x_2, \ldots x_N$. Next, using the numeric data values, processing logic calculates the following function (processing block 302).

$$f = \sum \frac{xC|x|}{|x|}$$

as defined above.

Then processing logic tests whether the result of the function is greater than zero (processing block 303). If the result of the function is greater than zero, then the LSB, referred to as L, is set equal to 1 (processing logic 304) and processing continues at processing block 306 if the result of the function is less than or equal to zero, then the LSB is set equal to 0 (processing block 305) and processing continues at processing block 306.

At processing block 306, variable i is set equal to 1. Next, processing logic tests whether data value $x_i$ is greater than zero (processing block 307). If the data value $x_i$ is greater than zero, then processing logic applies the following emit function to output all of the bits of the data value being quantized without the shared LSB:

$$EMIT \left\lfloor X + 1 - D - \frac{L}{2} \right\rfloor$$

(processing block 308); otherwise, processing logic applies the following emit function to output all of the bits of the data value being quantized without the shared LSB:

$$EMIT\left[X + D + \frac{(1-L)}{2}\right]$$

(processing block 309).

Processing logic then increments variable i (processing block 320) and tests to determine if variable i is greater than N (processing block 311). If not, processing loops back to processing block 300. If variable i is greater than N, then processing continues at processing block 312 where the LSB value L is emitted as the shared LSB for the numeric data values $x_1, x_2, \ldots x_N$.

Thereafter, processing logic tests whether there is more data to be encoded (processing block 313). If more data is to be encoded, processing loops back to processing block 301 and the process is repeated. On the other hand, if the end of the data has been reached, the process ends.

In the shared-LSB zeroish-data quantization environment the compressed (e.g., wavelet) coefficient +1 will be much more common than −1 when the shared-LSB is set off (e.g., the shared LSB is a logical 0 or low) and much less common when the shared-LSB is set on (e.g., the shared LSB is a logical 1 or high). The reconstruction levels for −1, 0, +1 are −1.25, −B, +0.75 when the LSB is off (e.g., 0) (where B≈0.15 for improved performance at typical bitrates).

In fact, the probability masses of the quantized tokens rather approximate a geometric series when the tokens are sorted by frequency.
This sorted order is

0,+1,−1,+2,−2,+3,−3,+4,−4,+5 . . .

when the LSB is off (0 or negative) but

0,−1,+1,−2,+2,−3,+3,−4,+4,−5 . . .

when the LSB is on (1 or positive).

The probabilities across a broad range of simulated Laplacian data are found to resemble geometric series. An exact geometric distribution leads to remarkable simplifications for compaction coding. In one embodiment, the unary code may be optimal for such a geometric distribution. The unary code is as follows:

0→0
1→10
2→110
3→1110
4→11110
:
N→N 1's followed by 0

Because of these features, after applying LSB sharing, the compressor may apply the unary code to the compressed data. Although the closeness of the probability series to a geometric series is only fair, it is good enough to use the unary code at least as a preliminary step in compression coding. That is, after applying the unary code, further compression coding may not be needed.

Even when another coder is to be used, the geometric series can be used to estimate compression costs. Moreover, the simple insight that Plus-Signs outnumber Minus-Signs when the Shared-LSB is off and that the Minus-Signs outnumber Plus-Signs when the Shared LSB is On suggests the use of an Exclusive-Or (XOR) function to perform sign inversion to greatly enhance compression performance, particularly in any unconstrained scheme where an LSB is shared by a block of "zeroish" data. Thus, in one embodiment, the coder performs an exclusive-OR (XOR) of the sign of the quantized datum with the shared-LSB before submitting the sign bit to a statistical coder like IBM's Q- or QM-coder, or other existing coders. This is referred to herein as sign inversion. The two sorted order lists given above for when the LSB is on and the LSB is off are equivalent to each other when the XOR function is used. Therefore, after generating a shared LSB, but before further coding, the sign bit may be converted to a modified sign bit equal to the sign bit XORed with the shared LSB. In other embodiments, the sign is XORed with the probability that the sign is in a predetermined state (e.g., negative, positive, etc.).

Moreover, a coder may consider coding cost versus distortion when choosing the setting of the Shared LSB. If the distribution follows a "folded-exponential" which is defined herein by example, a particularly tractable quantization formula emerges. A "folded-exponential code" is defined as a code that maps

0, +1, −1, +2, −2, +3, . . .

to 0, 1, 2, 3, 4, 5, . . . through folded ordering, or in "unary"

to 0, 10, 110, 1110, 11110, 111110, . . .

Note that the negative and positive number for all the pairs may be reversed so that the negative number appears before the positive number in the sequence.

The probability distribution for the code given above is any probability distribution where the ratio of successive terms in sequence prob(X=0), prob(X=+1), prob(X=−1), prob(X=+2), prob(X=−2), prob(X=+3), . . . is constant. This probability distribution closely approximates the token distribution in a shared-LSB system.

One embodiment of the "Folded-Exponential" code is as follows. Let p=Prob(LPS) denote the probability of an (internal) coding symbol.

| Input | Probability when LSB ON | Output when Shared-LSB ON | Output when Shared-LSB OFF |
|---|---|---|---|
| −3 | $p^5(1-p)$ | 111110 | 1111110 |
| −2 | $p^3(1-p)$ | 1110 | 11110 |
| −1 | $p(1-p)$ | 10 | 110 |
| 0 | $(1-p)$ | 0 | 0 |
| +1 | $p^2(1-p)$ | 110 | 10 |
| +2 | $p^4(1-p)$ | 11110 | 1110 |
| +3 | $p^6(1-p)$ | 1111110 | 111110 |

The output for X is simply y LPS's ("1") followed by an MPS ("0"), where y is given by $$y = \begin{cases} -2X - L & \text{if } X < 0 \\ 0 & \text{if } X = 0 \\ 2X + L - 1 & \text{if } X > 0 \end{cases}$$

where L is the shared LSB.

This folded-exponential code is applied after preparing the adjusted and quantized $x_i$ and after applying conditional sign inversion and before submitting the result to a general-purpose entropy coder (e.g., arithmetic coder). Assuming the LPS's have equal coding costs, there is a simple relationship among coding costs, leading to the formula given above.

Figure 4:
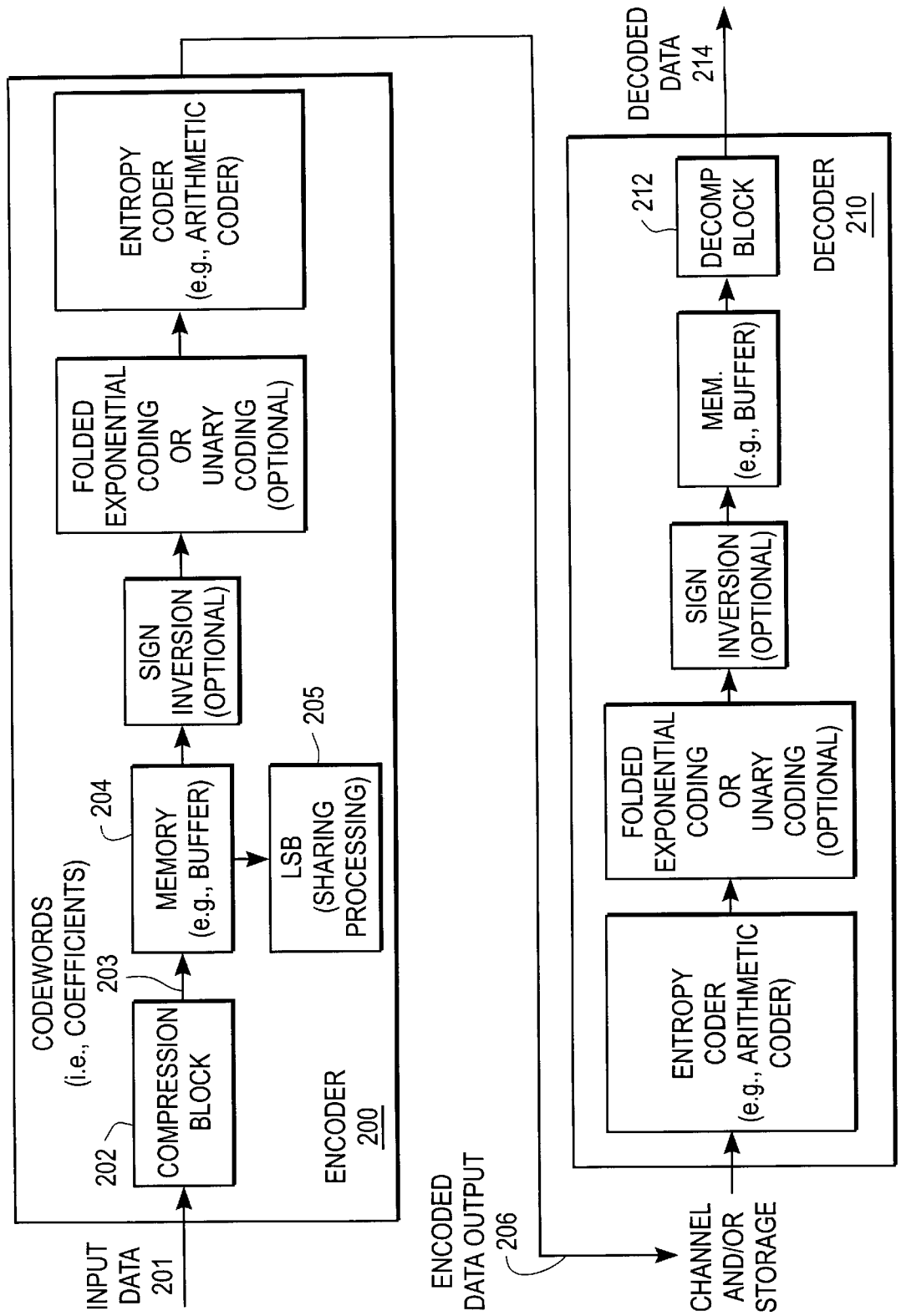
FIG. 4 illustrates an embodiment of an encoder and a decoder that utilizes the shared LSB processing along with the sign inversion and folded exponential coding and the respective reverse processes during decoding.

FIG. 4 illustrates an embodiment of an encoder and a decoder that utilizes the shared LSB processing along with the sign inversion and folded exponential coding (or unary coding) and the respective reverse processes during decoding.

Note that Folded-Exponential coding given above might be used in any compression application where data has the appropriate statistics. That is, the Folded-Exponential Coding may be used independently of a shared LSB coding.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a compression and decompression technique has been described.

I claim:

1. A method of encoding data, said method comprising:
   selecting numeric data to be quantized; and
   replacing the least significant bits (LSBS) of the numeric data with a single LSB shared by each numeric data value in the numeric data, wherein replacing the LSBs comprises providing the single LSB based on mean squared error (MSE).

2. The method defined in claim 1 further comprising:
   adjusting numeric data values based on a value selected for the single LSB.

3. The method defined in claim 1 wherein the numeric data is uniformly distributed.

4. The method defined in claim 1 wherein the numeric data is clustered near zero.

5. The method defined in claim 1 wherein each value of the numeric data comprises a coefficient.

6. The method defined in claim 1 wherein the numeric data comprises a block of transformed data.

7. A method of encoding data, said method comprising:
   selecting numeric data to be quantized; and
   replacing the least significant bits (LSBS) of the numeric data with a single LSB shared by each numeric data value in the numeric data, wherein replacing LSBs comprises setting the single LSB according to which binary value occurs most often among the LSBs of the numeric data values in the numeric data.

8. The method defined in claim 7 further comprising embedding the single LSB in a file compatible with an unwitting standard.

9. The method defined in claim 8 wherein the unwitting standard comprises JPEG.

10. A method of encoding data, said method comprising:
    selecting numeric data to be quantized; and
    replacing the least significant bits (LSBs) of the numeric data with a single LSB shared by each numeric data value in the numeric data, wherein replacing the LSBs comprises setting the single LSB according to which binary value occurs most often among the LSBs over a region of image data containing the numeric data.

11. A method of encoding data, said method comprising:
    selecting a group of numeric data to be quantized; and
    replacing the least significant bits (LSBs) of the numeric data with a single LSB shared by each numeric data value in the numeric data, wherein replacing the LSBs comprises setting the single LSB to a predetermined binary value if $$\sum_{x \in group} (2x - 2\lfloor x \rfloor - 1)\left(2\lfloor x \rfloor - 4\left\lfloor \frac{x}{2} \right\rfloor - 1\right) < 0.$$

12. The method defined in claim 11 wherein the predetermined binary value comprises 1.

13. A method of encoding data, said method comprising:
    selecting numeric data to be quantized;
    replacing the least significant bits (LSBs) of the numeric data with a single LSB shared by each numeric data value in the numeric data; and
    embedding the single LSB in a file compatible with an unwitting standard, wherein embedding the single LSB in the file comprises attaching the single LSB to one of said each numeric data value.

14. The method defined in claim 13 wherein the one of said each numeric data value comprises a coefficient.

15. A method of encoding data, said method comprising:
    selecting numeric data to be quantized;
    replacing the least significant bits (LSBS) of the numeric data with a single LSB shared by each numeric data value in the numeric data, and
    embedding the single LSB in a file compatible with an unwitting standard, wherein embedding the single LSB in the file comprises modifying a q-matrix.

16. The method defined in claim 15 wherein modifying the q-matrix comprises dividing a number in the q-matrix in half.

17. A method of encoding data, said method comprising:
    selecting a group of numeric data to be quantized; and
    replacing the least significant bits (LSBs) of the numeric data with a single LSB shared by each numeric data value in the numeric data, wherein replacing the least significant bit (LSBs) of the numeric data with a single LSB comprises setting the single LSB to a redetermined binary value if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 \rfloor \geq 1 \\ -z + K + 0.5 + \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

18. A method of encoding data, said method comprising:
    selecting numeric data to be quantized; and
    replacing the least significant bits (LSBs) of the numeric data with a single LSB shared by each numeric data value in the numeric data, wherein replacing the LSBs comprises converting the sign of said each numeric data value by exclusive-ORing the sign with the single LSB.

19. The method defined in claim 18 further comprising coding each numeric data value with a code that maps 0, +1, −1, +2, −2, +3, . . . to 0, 1, 2, 3, 4, 5, . . . respectively.

20. A method of encoding data, said method comprising:
    selecting numeric data to be quantized; and
    replacing the least significant bits (LSBs) of the numeric data with a single LSB shared by each numeric data value in the numeric data, wherein replacing the LSBs comprises converting the sign of each numeric data value by exclusive-ORing the sign with the probability that the sign is in a predetermined state.

21. The method defined in claim 20 wherein the predetermined state is negative.

22. An encoder comprising:
    means for receiving numeric data to be quantized; and
    means for replacing the least significant bit (LSBs) of the numeric data with a single LSB shared by each numeric data value in the numeric data, wherein the means for replacing comprises means for selecting the single LSB based on mean squared error (MSE).

23. The encoder defined in claim 22 further comprising means for adjusting numeric data values based on the selected value of the single LSB.

24. The encoder defined in claim 22 wherein the numeric data is uniformly distributed.

25. The encoder defined in claim 22 wherein the numeric data is clustered near zero.

26. The encoder defined in claim 22 wherein each numeric data value in the numeric data comprises a coefficient.

27. The encoder defined in claim 22 wherein the numeric data comprises a block of transformed data.

28. The encoder defined in claim 22 further comprises means for embedding the single LSB in a file compatible with an unwitting standard.

29. The encoder defined in claim 28 wherein the unwitting standard comprises JPEG.

30. An encoder comprising:
    means for receiving numeric data to be quantized; and
    means for replacing the least significant bit (LSBs) of the numeric data with a single LSB shared by each numeric data value in the numeric data, wherein the means for replacing comprises means for setting the single LSB according to which binary value occurs most often among the LSBs of the numeric data values in the numeric data.

31. An encoder comprising:
    means for receiving numeric data to be quantized; and
    means for replacing the least significant bit (LSBs) of the numeric data with a single LSB shared by each numeric data value in the numeric data, wherein the means for replacing comprises means for setting the single LSB according to which binary value occurs most often among the LSBs over a region of image data containing the numeric data.

32. An encoder comprising:
    means for receiving a group of numeric data to be quantized; and
    means for replacing the least significant bit (LSBs) of the numeric data with a single LSB shared by each numeric data value in the numeric data, wherein the means for replacing comprises means for setting the single LSB to a predetermined binary value if $$\sum_{x \in group} (2x - 2\lfloor x \rfloor - 1)\left(2\lfloor x \rfloor - 4\left\lfloor \frac{x}{2} \right\rfloor - 1\right) < 0.$$

33. The encoder defined in claim 32 wherein the predetermined binary value comprises 1.

34. An encoder comprising:
    means for receiving numeric data to be quantized;
    means for replacing the least significant bit (LSBs) of the numeric data with a single LSB shared by each numeric data value in the numeric data; and
    means for embedding the single LSB in a file compatible with an unwitting standard, wherein the means for embedding the single LSB in the file comprises means for attaching the single LSB to one of said each numeric data value.

35. The encoder defined in claim 34 wherein the one of said each numeric data value comprises a coefficient.

36. An encoder comprising:
    means for receiving numeric data to be quantized;
    means for replacing the least significant bit (LSBs) of the numeric data with a single LSB shared by each numeric data value in the numeric data; and
    means for embedding the single LSB in a file compatible with an unwitting standard, wherein the means for embedding the single LSB in the file comprises means for modifying a q-matrix.

37. The encoder defined in claim 36 wherein the means for modifying the q-matrix divides a number in the q-matrix in half.

38. An encoder comprising:
    means for receiving a group of numeric data to be quantized; and
    means for replacing the least significant bit (LSBs) of the numeric data with a single LSB shared by each numeric data value in the numeric data, wherein the means for replacing the least significant bit (LSBs) of the numeric data with a single LSB comprises means for setting the single LSB to a predetermined binary value if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \geq 1 \\ -z + K + 0.5 + \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

39. An encoder comprising:
    means for receiving numeric data to be quantized; and
    means for replacing the least significant bit (LSBs) of the numeric data with a single LSB shared by each numeric data value in the numeric data; wherein the means for replacing the LSBs comprises means for converting the sign of said each numeric data value by exclusive-ORing the sign with the single LSB.

40. The method defined in claim 39 further comprising coding each numeric data value with a code that maps
    0, +1, −1, +2, −2, +3, . . . to
    0, 1, 2, 3, 4, 5, . . . respectively.

41. An encoder comprising:
    means for receiving numeric data to be quantized; and
    means for replacing the least significant bit (LSBs) of the numeric data with a single LSB shared by each numeric data value in the numeric data, wherein the means for replacing the LSBs comprises means for converting the sign of each numeric data value by exclusive-ORing the sign with the probability that the sign is in a predetermined state.

42. The method defined in claim 41 wherein the predetermined state is negative.

43. An encoder comprising:
a memory to store a plurality of numeric data values; and
a least significant bit (LSB) processing logic coupled to the memory to replace LSBs of the plurality of numeric data values with a single LSB shared by the numeric data values, wherein the LSB processing logic provides the single LSB based on mean squared error (MSE).

44. The encoder defined in claim 43 wherein each of the plurality of numeric data values comprises a coefficient.

45. The encoder defined in claim 43 wherein the plurality of numeric data values comprises a block of transformed data.

46. An encoder comprising:
a memory to store a plurality of numeric data values; and
a least significant bit (LSB) processing logic coupled to the memory to replace LSBs of the plurality of numeric data values with a single LSB shared by the numeric data values, wherein the LSB processing logic sets the single LSB according to which binary value occurs most in the LSBs of the plurality of numeric data values.

47. An encoder comprising:
a memory to store a group of numeric data values; and
a least significant bit (LSB) processing logic coupled to the memory to replace LSBs of the group of numeric data values with a single LSB shared by the numeric data values, wherein the LSB processing logic sets the single LSB to a predetermined binary value if $$\sum_{x \in group} (2x - 2\lfloor x \rfloor - 1)\left(2\lfloor x \rfloor - 4\left\lfloor \frac{x}{2} \right\rfloor - 1\right) < 0.$$

48. The encoder defined in claim 47 wherein the predetermined binary value comprises 1.

49. An encoder comprising:
a memory to store a group of numeric data values; and
a least significant bit (LSB) processing logic coupled to the memory to replace LSBs of the group of numeric data values with a single LSB shared by the numeric data values, wherein the LSB processing logic sets the single LSB to a predetermined binary value if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \geq 1 \\ -z + K + 0.5 + \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

50. An encoder comprising:
a memory to store a plurality of numeric data values; and
a least significant bit (LSB) processing logic coupled to the memory to replace LSBs of the plurality of numeric data values with a single LSB shared by the numeric data values, the LSB processing logic to convert the sign of said each numeric data value by exclusive-ORing the sign with the single LSB.

51. The method defined in claim 50 further comprising coding each numeric data value with a code that maps 0, +1, −1, +2, −2, +3, . . . to 0, 1, 2, 3, 4, 5, . . . respectively.

52. An encoder comprising:
a memory to store a plurality of numeric data values; and
a least significant bit (LSB) processing logic coupled to the memory to replace LSBs of the plurality of numeric data values with a single LSB shared by the numeric data values, the LSB processing logic to convert the sign of each numeric data value by exclusive-ORing the sign with the probability that the sign is in a predetermined state.

53. The method defined in claim 52 wherein the predetermined state is negative.

54. A computer product comprising a sequence of instructions stored on a computer readable medium which, when executed by at least one processing device in a system, cause said at least one processing device to:
select numeric data in a set of data; and
replace the least significant bit (LSBs) of the numeric data with a single LSB to be shared by numeric data values in the numeric data by providing the single LSB based on mean squared error (MSE).

55. A computer product comprising a sequence of instructions stored on a computer readable medium which, when executed by at least one processing device in a system, cause said at least one processing device to:
select numeric data in a set of data; and
replace the least significant bit (LSBs) of the numeric data with a single LSB to be shared by numeric data values in the numeric data by setting the single LSB according to which binary value occurs most often among the LSBs of the numeric data values in the numeric data.

56. A computer product comprising a sequence of instructions stored on a computer readable medium which, when executed by at least one processing device in a system, cause said at least one processing device to:
select numeric data in a set of data: and
replace the least significant bit (LSBs) of the numeric data with a single LSB to be shared by numeric data values in the numeric data by setting the single LSB according to which binary value occurs most often among the LSBs over a region of image data containing the numeric data.

57. A computer product comprising a sequence of instructions stored on a computer readable medium which, when executed by at least one processing device in a system, cause said at least one processing device to:
select numeric data in a group of data; and
replace the least significant bit (LSBs) of the numeric data with a single LSB to be shared by numeric data values in the numeric data by setting the single LSB to a predetermined binary value if $$\sum_{x \in group} (2x - 2\lfloor x \rfloor - 1)\left(2\lfloor x \rfloor - 4\left\lfloor \frac{x}{2} \right\rfloor - 1\right) < 0.$$

58. A computer product comprising a sequence of instructions stored on a computer readable medium which, when executed by at least one processing device in a system, cause said at least one processing device to:

select numeric data in a set of data; and replace the least significant bit (LSBs) of the numeric data with a single LSB to be shared by numeric data values in the numeric data by converting the sign of said each numeric data value by exclusive-ORing the sign with the single LSB.

59. The computer product defined in claim 58 further comprising instructions which when executed by at least one processing device, cause said at least one processing device to:

code each numeric data value with a code that maps
    0, +1, −1, +2, −2, +3, . . . to
    0, 1, 2, 3, 4, 5, . . . respectively.

60. A computer product comprising a sequence of instructions stored on a computer readable medium which, when executed by at least one processing device in a system, cause said at least one processing device to:

select numeric data in a set of data; and replace the least significant bit (LSBs) of the numeric data with a single LSB to be shared by numeric data values in the numeric data by converting the sign of each numeric data value by exclusive-ORing the sign with the probability that the sign is in a predetermined state.

61. The computer product defined in claim 60 wherein the predetermined state is negative.

62. A computer product comprising a sequence of instructions stored on a computer readable medium which, when executed by at least one processing device in a system, cause said at least one processing device to:

select numeric data in a group of data; and replace the least significant bit (LSBs) of the numeric data with a single LSB to be shared by numeric data values in the numeric data by setting the single LSB to a predetermined binary value if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \geq 1 \\ -z + K + 0.5 + \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

63. A decoder comprising:

a receiver to receive a group of quantized numeric data sharing a single LSB; and a decoder coupled to the receiver to decode the quantized numeric data using the single LSB for each numeric data values, wherein the decoder decodes data that has been encoded by replacing the least significant bit (LSBs) of the numeric data with a single shared by each numeric data values in the group of numeric data by setting the single LSB to a predetermined binary value if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \geq 1 \\ -z + K + 0.5 + \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

64. A method of decoding data in which a plurality of encoded data values share a single LSB comprising:

generating a reconstructed data value for each of the plurality of encoded data values using the single LSB;

wherein generating the reconstructed data is performed according to the following equation:

$$\bar{x}_y = 2y_i + L - \tfrac{1}{2}$$

where $x_i$ is the reconstructed data value, $y_i$ is the most significant bit of the encoded data value being reconstructed and L is the single LSB being shared; and emitting the reconstructed data for each of the plurality of encoded data.

65. A method of encoding comprising:

selecting a group of numeric data to be quantized; and replacing the least significant bit (LSBs) of the numeric data with a single shared LSB by each numeric data values in the group of numeric data, wherein replacing the LSBs comprises setting the single LSB to a predetermined binary value L if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \geq 1 \\ -z + K + 0.5\lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

66. The method defined in claim 65 further comprising the setting the single LSB to a first predetermined value if $$\sum_{x \in group} \frac{xC(|x|)}{|x|} > 0$$

or setting the single LSB to a second predetermined value if $$\sum_{x \in group} \frac{xC(|x|)}{|x|} \leq 0$$

67. The method defined in claim 66 further comprising:

testing whether a data value is greater than zero;
applying a first emit function as follows $$EMIT\left\lfloor X + 1 - D - \frac{L}{2} \right\rfloor$$

to output all of the bits of the data value being quantized without the shared LSB if the data value is greater than 0;

applying a second emit function $$EMIT\left\lfloor X + D + \frac{(1-L)}{2} \right\rfloor$$

to output all of the bits of the data value being quantized without the shared LSB if the data value is not greater than 0.

68. The method defined in claim 65 further comprising converting the sign of each numeric data value by exclusive-ORing the sign with the single LSB.

69. The method defined in claim 65 further comprising converting the sign of each numeric data value by exclusive-ORing the sign with the probability that the sign is in a predetermined state.

70. The method defined in claim 69 wherein the predetermined state is negative.

71. An encoder comprising:

means for selecting a group of numeric data to be quantized; and means for replacing the least significant bit (LSBs) of the numeric data with a single shared LSB by each numeric data values in the group of numeric data, wherein replacing the LSBs comprises setting the single LSB to a predetermined binary value L if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 - D \rfloor \geq 1 \\ -z + K + 0.5 \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

72. The encoder defined in claim 71 wherein the means for comprising the steps of setting the single LSB to a first predetermined value if $$\sum_{x \in group} \frac{xC(|x|)}{|x|} > 0$$

or the means for setting the single LSB to a second predetermined value if $$\sum_{x \in group} \frac{xC(|x|)}{|x|} \leq 0$$

73. The encoder defined in claim 71 further comprising:

means for testing whether a data value is greater than zero;

means for applying a first emit function as follows $$EMIT\left\lfloor X + 1 - D - \frac{L}{2} \right\rfloor$$

to output all of the bits of the data value being quantized without the shared LSB if the data value is greater than 0;

means for applying a second emit function as follows $$EMIT\left\lfloor X + D + \frac{(1-L)}{2} \right\rfloor$$

to output all of the bits of the data value being quantized without the shared LSB if the data value is not greater than 0.

74. The encoder defined in claim 73 further comprising a means for converting the sign of each numeric data value by exclusive-ORing the sign with the single LSB.

75. The encoder defined in claim 71 further comprising a means for converting the sign of each numeric data value by exclusive-ORing the sign with the probability that the sign is in a predetermined state.

76. The encoder defined in claim 75 wherein the predetermined state is negative.

77. A computer product comprising a sequence of instructions stored on a computer readable medium which, when executed by at least one processing device in a system, cause said at least one processing device to:

select a group of numeric data to be quantized; and replace the least significant bit (LSBs) of the numeric data with a single shared LSB by each numeric data values in the group of numeric data, wherein replacing the LSBs comprises setting the single LSB to a predetermined binary value L if $$\sum_{x \in group} \frac{xC(|x|)}{|x|} > 0$$

where $$C(z) = \begin{cases} 4zB & \text{if } z < D \\ 2z(B - .75) + 9/16 - B^2 + K & \text{if } D < z < D + .5 \\ z - K - \lfloor z + .5 - D \rfloor & \text{if } \lfloor z + 1 - D \rfloor = \lfloor z + .5 \rfloor \geq 1 \\ -z + K + 0.5 + \lfloor z + .5 - D \rfloor & \text{if } \lfloor z + 1 - D \rfloor > \lfloor z + .5 - D \rfloor \geq 1 \end{cases}$$

and variables B, D and K refer to the reconstruction level for any zero, the bias for quantization thresholds and the appropriately scaled ratio between rate and distortion costs, respectively.

78. The computer product defined in claim 77 further comprising instructions which when executed by at least one processing device, cause said at least one processing device to:

set the single LSB to a first predetermined value if $$\sum_{x \in group} \frac{xC(|x|)}{|x|} > 0$$

or setting the single LSB to a second predetermined value if $$\sum_{x \in group} \frac{xC(|x|)}{|x|} \leq 0$$

79. The computer product defined in claim 78 further comprising instructions which when executed by at least one processing device, cause said at least one processing device to:

test whether a data value is greater than zero;

apply the following emit function $$EMIT \left\lfloor X + 1 - D - \frac{L}{2} \right\rfloor$$

to output all of the bits of the data value being quantized without the shared LSB if the data value is greater than 0;

apply the following emit function $$EMIT \left\lfloor X + D + \frac{(1-L)}{2} \right\rfloor$$

to output all of the bits of the data value being quantized without the shared LSB if the data value is not greater than 0.

* * * * *